United States Patent [19]

Coussot

[11] 3,838,366

[45] Sept. 24, 1974

[54] MONOLITHIC ELECTRO-MECHANICAL FILTERS

[75] Inventor: Gerard J. Coussot, Paris, France

[73] Assignee: Thomson-CSF, Paris, France

[22] Filed: May 18, 1973

[21] Appl. No.: 361,617

[30] Foreign Application Priority Data

May 24, 1972 France .............................. 72.18485

[52] U.S. Cl. ...................... 333/72, 310/8.2, 310/9.8, 333/30 R

[51] Int. Cl. .......................... H03h 9/26, H01v 7/00

[58] Field of Search .............. 333/72, 30 R; 310/8.1, 310/8.2, 9.5, 9.7, 9.8

[56] References Cited

UNITED STATES PATENTS

| | | | |
|---|---|---|---|
| 3,551,837 | 12/1970 | Speiser et al. | 333/72 X |
| 3,569,750 | 3/1971 | Beaver | 310/9.5 |
| 3,585,537 | 6/1971 | Rennick et al. | 333/72 |

*Primary Examiner*—James W. Lawrence
*Assistant Examiner*—Marvin Nussbaum
*Attorney, Agent, or Firm*—Cushman, Darby & Cushman

[57] ABSTRACT

The present invention relates to monolithic electro-mechanical filters comprising coupled resonators obtained by the deposition of electrodes upon a piezoelectric wafer. In accordance with the present invention, there is provided an electro-mechanical filter wherein the coupled resonators in two collateral transmission paths, have mutually different resonance frequencies; a step being provided in the wafer, between said transmission paths.

6 Claims, 9 Drawing Figures

MONOLITHIC ELECTRO-MECHANICAL FILTERS

The present invention relates to electro-mechanical filters designed for the selective transmission of electrical signals or for the switching of these signals to transmission channels which have several frequency bands.

It relates more particularly to filters which comprise a wafer of piezoelectric material, equipped on both its faces with mutually opposite electrodes designed to constitute coupled resonators. The resonance and anti-resonance frequencies of a resonator of piezoelectric wafer design, are relatively close to one another, and this means that the coupling coefficient of the resonator is well below unity. Consequently, the frequency band transmitted by a filter made of two coupled resonators, is of limited relative value. In certain applications, a wide frequency band is required for the filtering or switching of electrical signals. To this end, recourse can be had to several matched filters having transmission bands whose frequencies are staggered but the grouping of these filters gives rise to matching problems because it is necessary not only to take account of manufacturing tolerances, but also of the temperature drift of each of the components.

To overcome these difficulties, the invention proposes an electro-mechanical filter of monolithic structure, the piezoelectric substrate of which has a non-uniform thickness and whose electrodes are arranged at the ends of several collateral transmission paths.

In accordance with the present invention, there is provided an electro-mechanical filter comprising: a piezoelectric wafer having two large faces, two pairs of mutually opposite electrodes arranged on said faces along a transmission path for building up two coupled resonators, and at least two further pairs of mutually opposite electrodes arranged on said faces along a further transmission path for building up two further coupled resonators; said transmission paths being collateral paths, and the resonance frequency of the resonators lying on said transmission path being different from the resonance frequency of the resonators lying on said further transmission path.

For a better understanding of the present invention, and to show how the same may be carried into effect, reference will be made to the ensuing description and the attached figures among which:

FIG. 1 shows a coupled resonator electro-mechanical filter of conventional design. This filter comprises:

Figure 1:
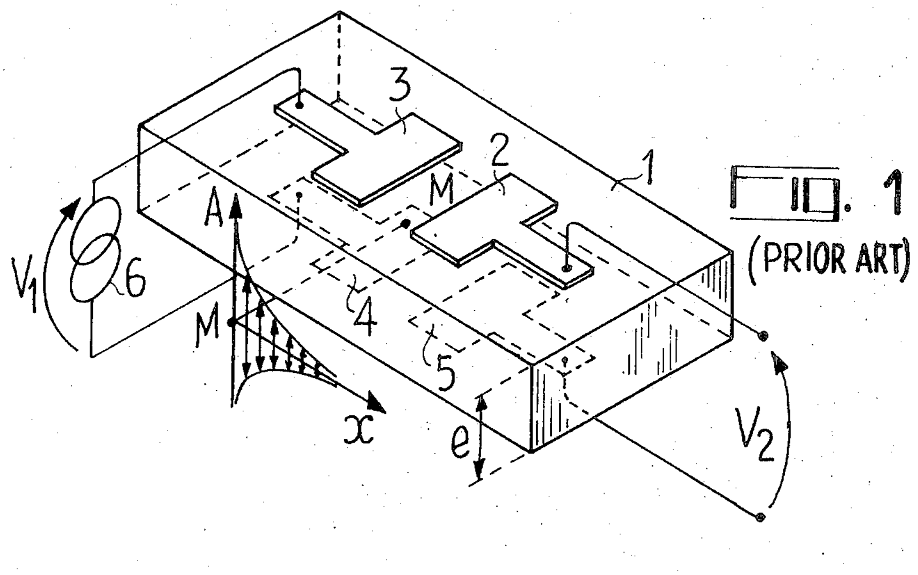
FIG. 1 (PRIOR ART)
FIG. 1 illustrates a filter with coupled resonators, of known design.

a piezoelectric wafer 1 having a thickness e, a pair of electrodes 3, 4 arranged respectively upon the large faces of the wafer 1 in order to form a first resonator, and another pair of electrodes 2, 5 arranged in the same fashion in order to form a second resonator. When a generator 6 producing an alternating voltage $V_1$ is used to supply the electrodes 3 and 4, a voltage $V_2$ is picked off across the terminals 2 and 5. The voltage $V_2$ is due to a partial transfer of vibrational energy which takes place between the resonators along the $x$ coordinate of the plane of the large faces of the wafer 1. The volume comprised between the electrodes 3 and 4 of the first resonator is the source of a vibrational motion having an amplitude A at the point M; this vibrational motion is produced by the voltage $V_1$ and thus, as those skilled in the art will be aware, corresponds either to the thickness mode or to the shear mode.

Moving away from the point M in the direction $x$, it will be observed that the vibrational amplitude A decreases and this is indicated by the diagram provided to one side of FIG. 1. If the electrodes 2 and 5 of the second resonator are sufficiently close to those of the first, that region of the wafer located between the electrodes 2 and 5 will experience a vibrational motion which gives rise to the voltage $V_2$.

Figure 3:
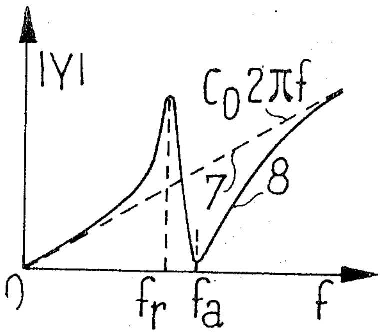
FIGS. 3 and 4 are explanatory diagrams.

Considered alone, the resonator 3, 4 is equivalent to an electrical dipole whose admittance Y has very sharp maxima and minima. In FIG. 3, the graph 8 illustrates the modulus Y of this admittance, as a function of the frequency $f$ of the voltage $V_1$ applied to the resonator. This curve oscillates about the straight line 7 which represents the variation of the susceptance of the capacitance $C_o$ created between the electrodes of the resonator; a first very sharp peak in the curve 8 occurs when the frequency f reaches the resonance frequency $f_r$. This peak or maximum is followed by a mini um located at the anti-resonance frequency $f_1$. These spikes in the curve 8 are due to the fundamental half-wave vibrational mode of the piezo-electric wafer 1; the frequencies $f_r$ and $f_a$ are associated with the thickness $e$ of the plate 1, and with the phase velocity C of the vibrational waves excited therein; other resonance and anti-resonance frequencies appear if the wafer vibrates in accordance with a partial mode.

Considering the fundamental mode, it will be seen that the resonator 3, 4 is electrically equivalent to a capacitor $C_o$ bridging a series R L C circuit.

Figure 2:
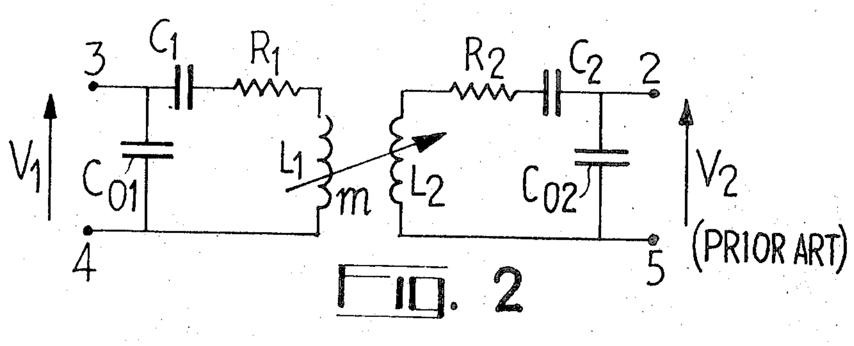
FIG. 2 (PRIOR ART)
FIG. 2 illustrates the equivalent circuit diagram of the filter shown in FIG. 1.

In FIG. 2, an equivalent circuit diagram of the electromechanical filter shown in FIG. 1, has been illustrated.

Figure 4:
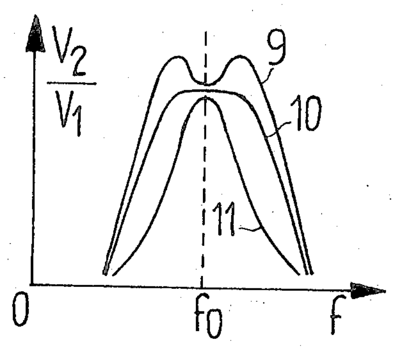

In accordance with what has just been stated, this diagram comprises, at the left, a network representing the resonator 3, 4 with its inherent capacitance $C_{01}$, and the resonance circuit $R_1$, $L_1$, $C_1$; the other network $C_{02}$, $R_2$, $L_2$, $C_2$, represents the resonator 2, 5 which we will assume to be identical to the first. To indicate the transfer of vibrational energy through which the mechanical coupling between the resonators is achieved, the equivalent inductances $L_1$ and $L_2$ have a mutual inductance m. The frequency response curves of the electro-mechanical filter with the coupled resonators are reproduced in the diagram of FIG. 4 which shows the amplitude transmission ratio $V_2/V_1 = f(f)$. The centre frequency of the transmission band $f_o$, is a function of the thickness $e$ of the piezo-electric wafer 1. The 3dB relative bandwidth $\Delta f/f_o$, depends upon the coupling of the resonators and upon the coupling coefficient k which is fixed for each resonator by the following relationship:

$$k^2 = fa^2 - f_r^2/f_a^2$$

If the coupling between the resonators is loose, then the transmission characteristic 11 is obtained. If the coupling is tight, then a curve with two peaks 9 is obtained. If the coupling is critical, the curve 10 is obtained, with a 3dB relative bandwidth which is given by the following formula in the case of the fundamental mode:

$$\Delta f/f_o \approx k^2/4$$

The values usually encountered for the coupling coefficient $k$ are around 0.01 for quartz and 0.3 for piezo-electric ceramics.

It will be seen therefore, that it is impossible to produce a filter of the kind shown in FIG. 1, which has a passband $\Delta f$ at $f_o = 10.7$ Megahertz, substantially in excess of 200 kilohertz.

In order to obtain a substantially larger bandwidth, the invention provides for the combination upon one and the same piezo-electric wafer and in accordance with at least two collateral transmission paths, of coupled resonators having different resonance frequencies.

Figure 5:
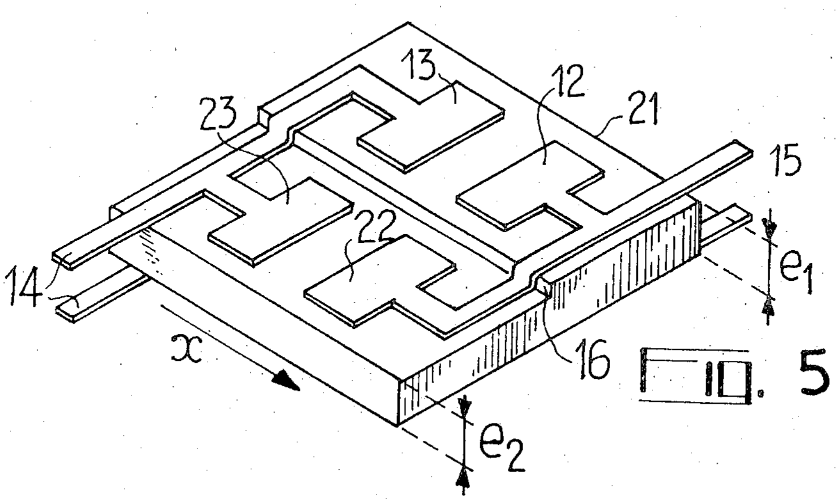
FIG. 5 is an isometric view of a first embodiment of a filter in accordance with the invention.
Figure 8:
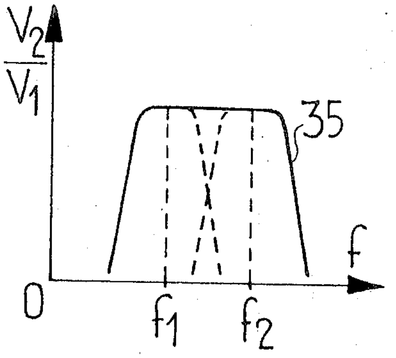
FIGS. 8 and 9 are explanatory diagrams relating respectively to FIGS. 5 and 6.

FIG. 5 provides an isometric view of an electro-mechanical filter with coupled resonators, comprising two collateral transmission paths oriented in the $x$ direction. One of the features of this monolithic structure resides in the cutting of steps in the wafer 21, with a stepped-down portion 16 located between the two coupling paths. At each side of the step 16, electrodes 12, 13, 22 and 23 are arranged which co-operate with similar mating electrodes on the hidden surface of the wafer 21, in order to form four resonators which are mechanically coupled in pairs. The resonators 22 and 23 have a resonance frequency determined by the thickness $e_2$, whilst the resonators 12 and 13 have a resonance frequency determined by the thickness $e_1$. Because of the presence of the steps 16, two contiguous filters similar to the filter of FIG. 1 have been produced but whose centre transmission frequencies $f_1$ and $f_2$ are staggered in a manner shown in the diagram of FIG. 8. The excitation signal is applied to the structure shown in FIG. 5, through leads 14 which interconnect the electrodes 13 and 23; the transmitted signal is picked up between the leads 15 which interconnect the electrodes 12 and 22. The diagram of FIG. 8 illustrates the transmission characteristic 35 of the composite filter shown in FIG. 5; the ratio of the output voltage to the input voltage is $V_2/V_1$ and the transmitted frequency band is made up of two staggered transmission bands having centre frequencies $f_1$ and $f_2$. The thicknesses $e_1$ and $e_2$ are inversely proportional to the frequence $f_1$ and $f_2$ and the step 16 can be produced by partial etching of one of the large faces of the wafer 21; if the step is a small one, it can be produced by ion machining prior to the deposition of the electrodes.

Figure 6:
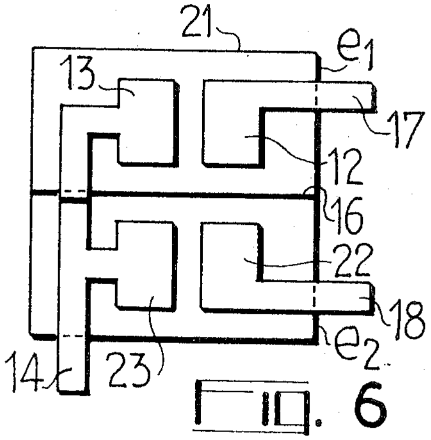
FIG. 6 is a plan view of a second embodiment of a filter in accordance with the invention.
Figure 9:
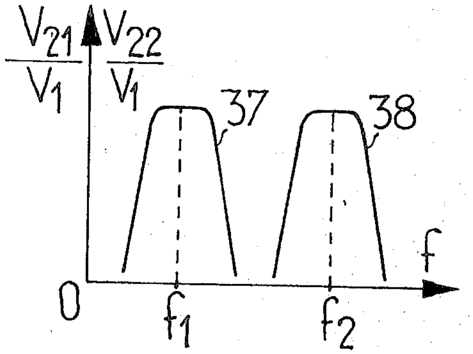

FIG. 6 shows a plan view of a first variant embodiment of the composite filter shown in FIG. 5. It differs from the latter simply in terms of the output connections 17 and 18 which separately link the electrodes 12 and 22. This variant embodiment is designed more particularly for the switching or selection of electrical signals. The diagram of FIG. 9 illustrates how the transmission ratio $V_{21}/V_1$ and $V_{22}/V_1$ of the two branches of the filter shown in FIG. 6, vary as a function of the frequency f. The transmission characteristic 37 relates to the output 17; it has a centre frequency $f_1$, determined by the thickness $e_1$. The transmission characteristic 38 relates to the output 18; its centre frequency $f_2$ is determined by the thickness $e_2$ which is less than $e_1$.

Figure 7:
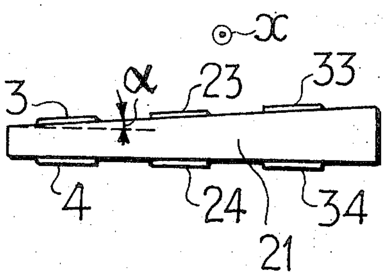
FIG. 7 is an end view of a third embodiment of a filter in accordance with the invention.

In FIG. 7, an end view of another embodiment applicable to the filters of FIGS. 5 and 6, can be seen. Instead of cutting steps in the plate 21, a wedge form with a slope has been used. The sets of electrodes (3, 4), (23, 24) and (33, 34) thus have different spacings; they delimit three transmission paths perpendicular to the plane of the figure. The sets of electrodes can be provided in larger numbers than illustrated, and their connections can be effected in accordance with FIGS. 5 and 6 in order to produce wide-band filters or multiple channels coupling devices.

In closing, it should be pointed out that the examples given of the way in which the piezo-electric wafer is cut, are in no way limitative of the scope of the invention. It is not necessary to provide flat steps covering the whole of the area of the wafer; the necessary reduction in thickness can be constituted, taking the case of ion machining for example, by a local depression limited to the zone of deposition of the electrodes.

What I claim is:

1. Electro-mechanical filter comprising: a piezo-electric wafer having two large faces, two pairs of mutually opposite electrodes arranged on said faces along a transmission path for building up two coupled resonators, and at least two further pairs of mutually opposite electrodes arranged on said faces along a further transmission path for building up two further coupled resonators, said transmission paths being collateral paths, and the resonance frequency of the resonators lying on said transmission path being different from the resonance frequency of the resonators lying on said further transmission path.

2. Electro-mechanical filter as claimed in claim 1, wherein said wafer has a non-uniform thickness; said collateral paths being located in regions of said wafer separated by at least one step.

3. Electro-mechanical filter as claimed in claim 1, wherein said electrodes located in each of said faces and at one of end of said collateral paths, are electrically connected with one another.

4. Electro-mechanical filter as claimed in claim 2, wherein said collateral paths are separated from one another by at least one step formed in at least one of said faces; the edge of said step being collateral with said paths.

5. Electro-mechanical filter as claimed in claim 3, wherein said electrodes located in each of said faces and at the other end of said paths, are electrically connected with one another.

6. Electro-mechanical filter comprising: a piezoelectric wafer having two large faces disposed obliquely in relation to one another, two pairs of mutually opposite electrodes arranged on said faces along a transmisson path for building up two coupled resonators, and at least two further pairs of mutually opposite electrodes arranged on said faces along a further transmission path for building up two further coupled resonators, said transmission paths being collateral paths, and the resonance frequency of the resonators lying on said transmission path being different from the resonance frequency of the resonators lying on said further transmission path; said paths being arranged substantially along level lines of said wafer.

* * * * *